United States Patent
Mori et al.

(10) Patent No.: US 6,638,803 B2
(45) Date of Patent: Oct. 28, 2003

(54) SEMICONDUCTOR DEVICE AND METHOD FOR MANUFACTURING THE SAME

(75) Inventors: Kiyoshi Mori, Tokyo (JP); Akinobu Teramoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/117,194

(22) Filed: Apr. 8, 2002

(65) Prior Publication Data

US 2002/0110969 A1 Aug. 15, 2002

Related U.S. Application Data

(62) Division of application No. 09/592,984, filed on Jun. 13, 2000.

(30) Foreign Application Priority Data

Jan. 18, 2000 (JP) ........................................ 2000-008998

(51) Int. Cl.$^7$ ........................................ H01L 21/8238
(52) U.S. Cl. ........................ 438/199; 438/211; 438/218; 438/527; 438/592; 438/655; 438/659
(58) Field of Search ........................ 438/199, 211, 438/218, 527, 530, 587, 655, 659, 592; 257/338, 351, 369, 377

(56) References Cited

U.S. PATENT DOCUMENTS

| | | | | |
|---|---|---|---|---|
| 4,669,176 A | * | 6/1987 | Kato | 29/571 |
| 5,285,096 A | | 2/1994 | Ando et al. | 257/379 |
| 5,455,438 A | | 10/1995 | Hashimoto et al. | 257/391 |
| 5,488,248 A | | 1/1996 | Lee et al. | 257/382 |
| 5,600,167 A | | 2/1997 | Urayama | 257/335 |
| 5,723,356 A | * | 3/1998 | Tsukamoto | 437/57 |
| 5,770,494 A | * | 6/1998 | Yamamoto et al. | 430/232 |
| 5,851,922 A | | 12/1998 | Bevk et al. | 438/655 |
| 5,886,363 A | | 3/1999 | Hamada et al. | 257/48 |
| 5,923,999 A | | 7/1999 | Balasubramanyam et al. | 438/592 |
| 5,969,396 A | | 10/1999 | Iwasa et al. | 257/408 |
| 6,005,296 A | | 12/1999 | Chan | 257/904 |
| 6,037,638 A | | 3/2000 | Abe et al. | 257/393 |
| 6,091,106 A | | 7/2000 | Park | 257/330 |
| 6,093,946 A | | 7/2000 | Li et al. | 257/318 |
| 6,153,907 A | | 11/2000 | Huang et al. | 257/327 |
| 6,162,716 A | | 12/2000 | Yu et al. | 438/592 |
| 6,163,054 A | | 12/2000 | Kim | 257/344 |
| 6,174,775 B1 | | 1/2001 | Liaw | 438/283 |
| 6,178,110 B1 | | 1/2001 | Hayashi | 365/154 |
| 6,184,588 B1 | | 2/2001 | Kim et al. | 257/903 |
| 6,204,538 B1 | | 3/2001 | Kim | 257/371 |
| 6,232,642 B1 | | 5/2001 | Yamazaki | 257/404 |
| 6,248,675 B1 | | 6/2001 | Xiang et al. | 438/926 |
| 6,417,570 B1 | * | 7/2002 | Ma et al. | 257/760 |
| 6,420,758 B1 | * | 7/2002 | Nakajima | 257/350 |

FOREIGN PATENT DOCUMENTS

| | | | | |
|---|---|---|---|---|
| JP | 4-61377 | | 2/1992 | |
| JP | 4-05-226616 | | 9/1993 | 257/904 |
| JP | 4-06-097392 | | 4/1994 | 257/903 |
| JP | 06-236994 A | * | 8/1994 | H01L/29/784 |
| JP | 7-135208 | | 5/1995 | |
| JP | 7-221097 A | | 8/1995 | |
| JP | 8-321612 | | 12/1996 | |
| JP | 10-144805 | | 5/1998 | |
| JP | 11-204659 | | 7/1999 | |

* cited by examiner

Primary Examiner—William David Coleman
Assistant Examiner—Hsien Ming Lee
(74) Attorney, Agent, or Firm—McDermott, Will & Emery

(57) ABSTRACT

Isolation regions 12 are formed on a silicon substrate 10 to isolate NMOS and PMOS regions in which to form NMOS and PMOS transistors respectively. A silicon oxide film 14 and an amorphous silicon film 16 are formed as a gate insulating film on the silicon substrate 10. N-type impurities are injected into the NMOS regions (FIG. 1A). A WSi film 22 is formed on the amorphous silicon film 16, and N-type impurities are injected only into the PMOS regions of the film 16 (FIG. 1C). A silicon oxide film 28 and a silicon nitride film 30 are formed on the WSi film 22 and then etched into gate electrodes (FIG. 1E).

9 Claims, 4 Drawing Sheets

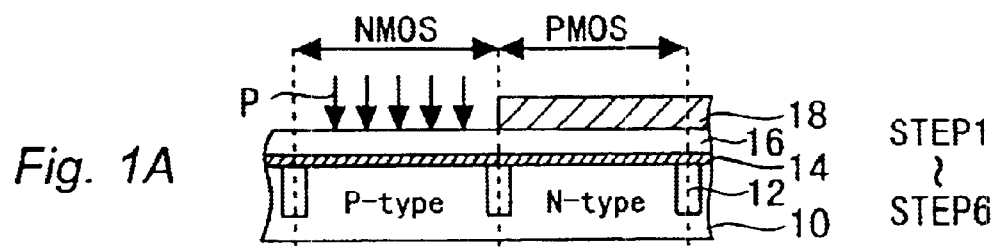
Fig. 1A  STEP1 ~ STEP6
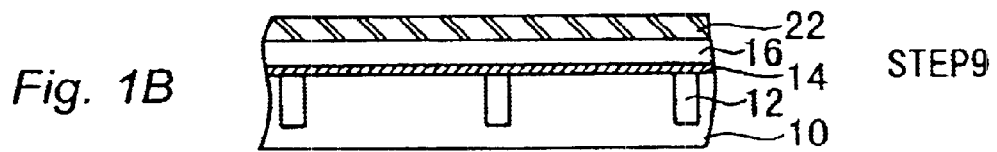
Fig. 1B  STEP9
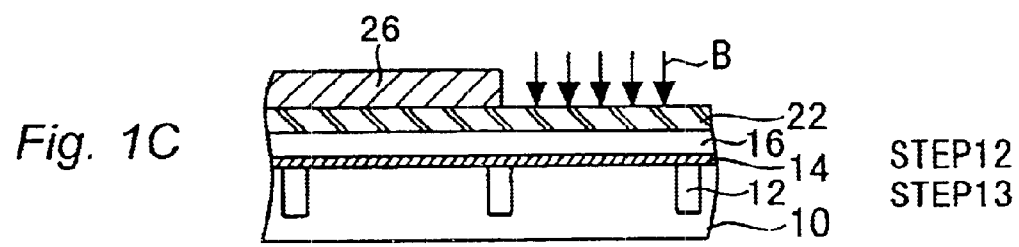
Fig. 1C  STEP12 STEP13
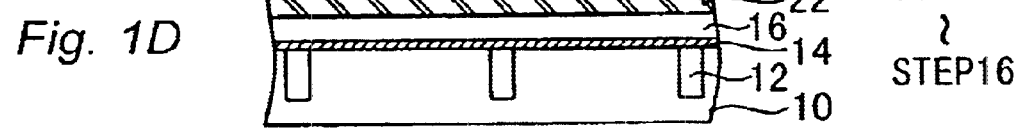
Fig. 1D  STEP14 ~ STEP16
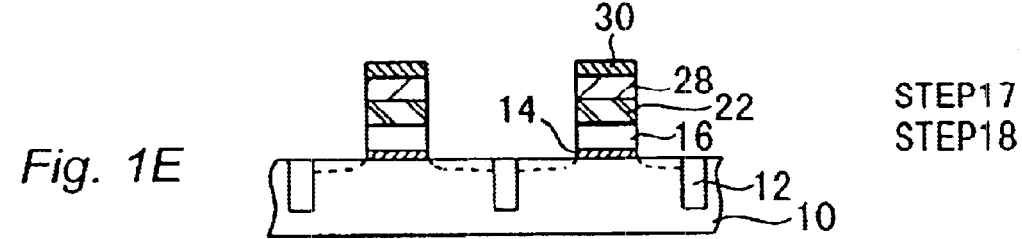
Fig. 1E  STEP17 STEP18
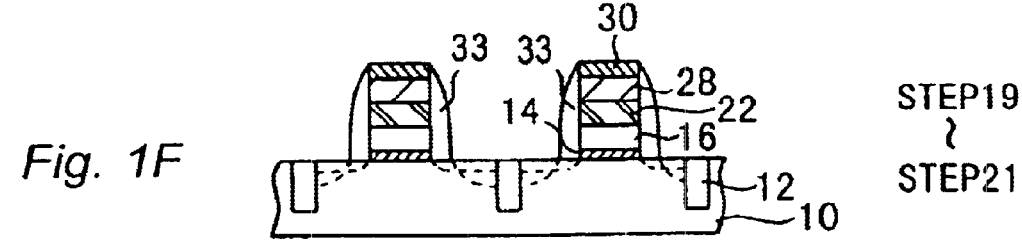
Fig. 1F  STEP19 ~ STEP21

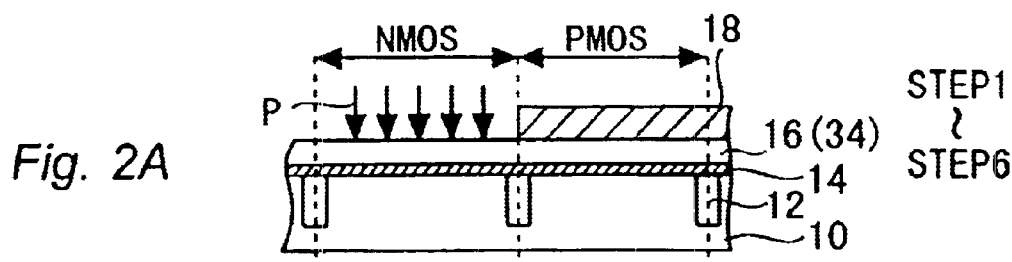
*Fig. 2A*  STEP1 ~ STEP6
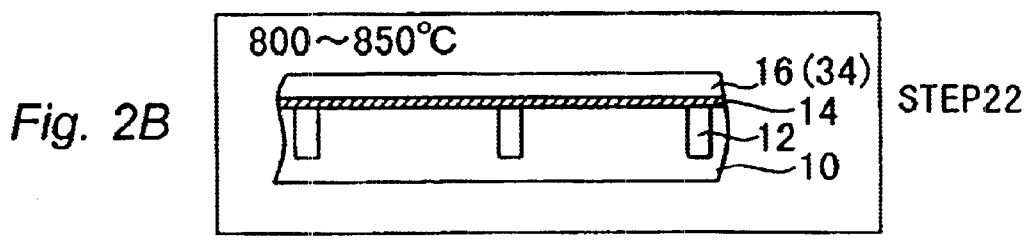
*Fig. 2B*  STEP22
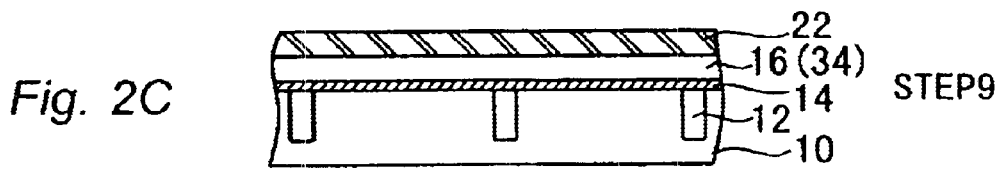
*Fig. 2C*  STEP9
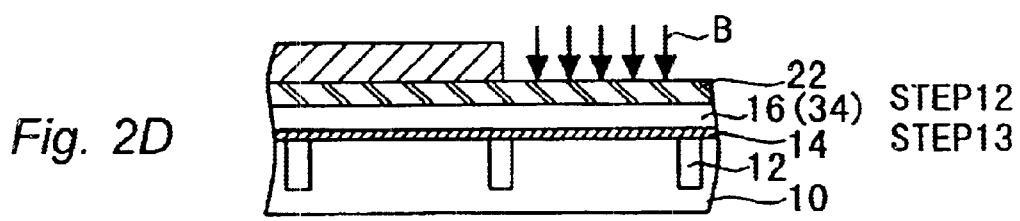
*Fig. 2D*  STEP12 STEP13
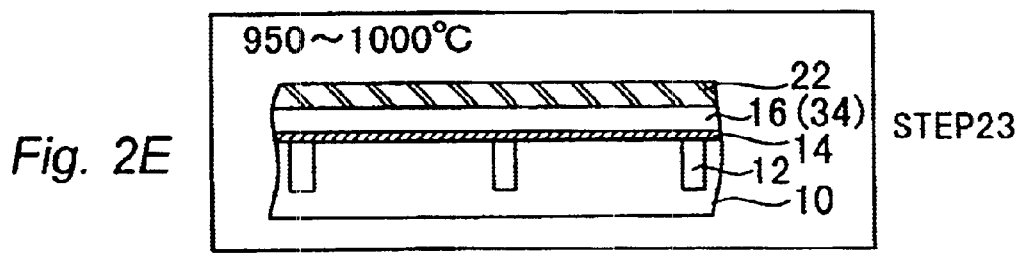
*Fig. 2E*  STEP23
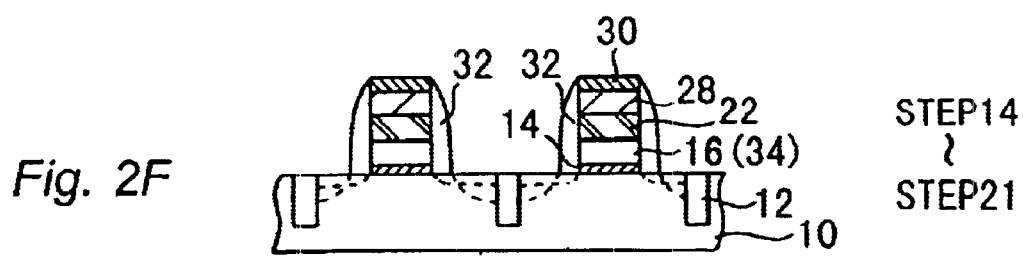
*Fig. 2F*  STEP14 ~ STEP21

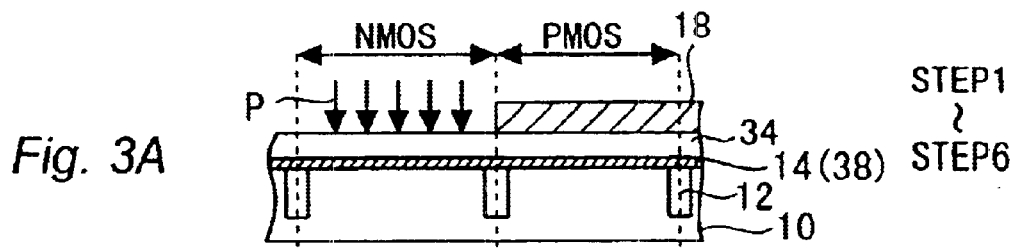
Fig. 3A — STEP1 ~ STEP6
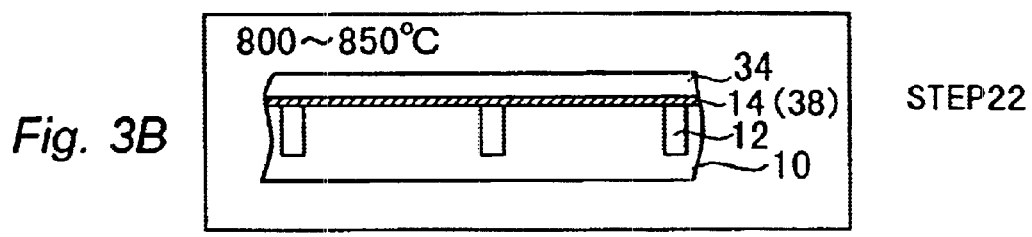
Fig. 3B — STEP22
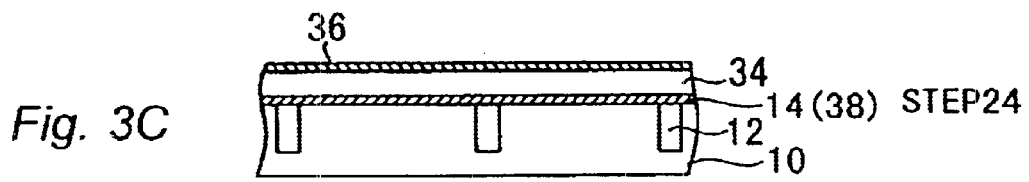
Fig. 3C — STEP24
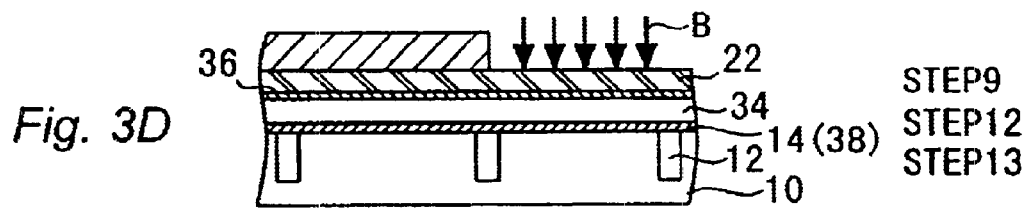
Fig. 3D — STEP9, STEP12, STEP13
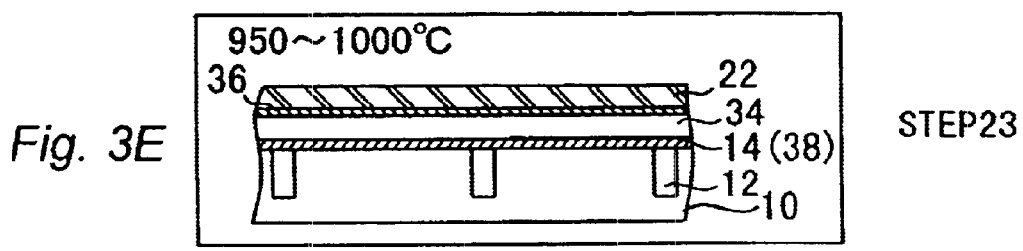
Fig. 3E — STEP23
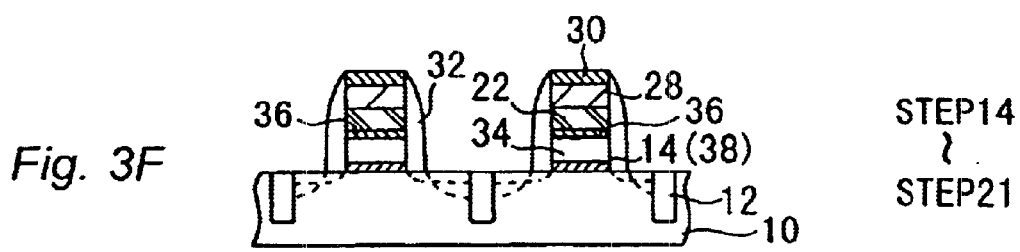
Fig. 3F — STEP14 ~ STEP21

SEMICONDUCTOR DEVICE AND METHOD FOR MANUFACTURING THE SAME

This application is a divisional of U.S. application Ser. No. 09/592,984, filed Jun. 13, 2000.

BACKGROUND OF THE INVENTION

1. Field of the Invention

The present invention relates to a semiconductor device and a method for manufacturing the same. More particularly, the invention relates to a semiconductor device comprising MOS (metal oxide semiconductor) transistors and a method for manufacturing that semiconductor device.

2. Description of the Background Art

FIGS. 4A through 4F are cross-sectional views showing structures of conventional MOS transistors and steps to fabricate such transistors. These steps constitute a method for producing MOS transistors containing within their gate electrodes a stacked film made of tungsten silicide (WSi) and polysilicon, i.e., MOS transistors in a WSi-polycide structure. The steps also make up a method for having NMOS transistors and PMOS transistors formed adjacent to one another on a single substrate.

Conventionally, as shown in FIG. 4A, isolation regions 12 are first formed to a depth of 4,000 angstroms by use of an insulating film such as an oxide film on a silicon substrate 10. The isolation regions 12 are laid out so as to isolate NMOS and PMOS regions (where NMOS and PMOS transistors are to be formed respectively) from one another on the silicon substrate 10 (step 1).

The silicon substrate 10 is arranged so that the NMOS regions will serve as P-type semiconductors and PMOS regions as N-type semiconductors (step 2).

On the surface of the silicon substrate 10, a silicon oxide film 14 to be used later as a gate insulating film is formed to a thickness of 40 angstroms (step 3).

On the silicon oxide film 14, polysilicon is deposited by low-pressure CVD. This forms a polysilicon film 16 having a thickness of 1,000 angstroms (step 4).

On the polysilicon film 16, a resist film 18 is patterned so as to expose the NMOS regions while covering the PMOS regions (step 5).

With the resist film 18 used as a mask, N-type impurities consisting of phosphorus (P) are injected at 10 keV with a density of $8 \times 10^{15}$ atoms/cm$^2$ into the NMOS regions of the polysilicon film 16 (step 6).

As depicted in FIG. 4B, a resist film 20 is patterned so as to expose the PMOS regions while covering the NMOS regions on the polysilicon film 16 (step 7).

Then with the resist film 20 used as a mask, P-type impurities consisting of BF$_2$ are injected at 10 keV with a density of $6 \times 10^{15}$ atoms/cm$^2$ into the PMOS regions of the polysilicon film 16 (step 8).

As indicated in FIG. 4C, a WSi film 22 with a thickness of 1,000 angstroms is formed on the polysilicon film 16 (step 9).

On the WSi film 22, a resist film 24 is patterned so as to expose the NMOS regions while covering the PMOS regions (step 10).

With the resist film 24 used as a mask, N-type impurities consisting of phosphorus (P) are injected at 30 keV with a density of $2 \times 10^{15}$ atoms/cm$^2$ into the NMOS regions of the WSi film 22 (step 11).

As shown in FIG. 4D, a resist film 26 is patterned on the WSi film 22 so as to expose the PMOS regions while covering the NMOS regions (step 12).

With the resist film 26 used as a mask, P-type impurities consisting of boron (B) are injected at 10 keV with a density of $4 \times 10^{15}$ atoms/cm$^2$ into the PMOS regions of the WSi film 22 (step 13).

On the WSi film 22, as depicted in FIG. 4E, a silicon oxide film 28 with a thickness of 1,000 angstroms is formed (step 14).

Thereafter, a silicon nitride film 30 with a thickness of 500 angstroms is formed on the silicon oxide film 28 (step 15).

On the silicon nitride film 30, a resist film 32 is formed. The resist film 32 thus furnished is patterned into gate electrodes by photolithography (step 16).

As indicated in FIG. 4F, the silicon nitride film 30 is patterned into gate electrodes by etching, with the resist film 32 used as a mask (step 17).

The silicon nitride film 30 thus patterned is used as a mask for anisotropic etching whereby the silicon oxide film 28, WSi film 22, polysilicon film 16 and silicon oxide film 14 are patterned successively into gate electrodes (step 18).

N-type impurities are injected into the NMOS regions of the silicon substrate in order to form LDD (Lightly Doped Drain) regions. P-type impurities are injected into the PMOS regions of the substrate to form the same type of regions (step 19).

An insulating film such as a silicon oxide film is deposited all over the wafer. The insulating film thus furnished is subjected to anisotropic etching whereby sidewalls 33 protecting the sides of the gate electrodes are formed (step 20).

N-type impurities are injected into the NMOS regions of the silicon substrate in order to form source and drain regions of the NMOS transistors. P-type impurities are injected into the PMOS regions of the substrate to form source and drain regions of the PMOS transistors (step 21).

As described, the conventional manufacturing method involves injecting N-type impurities (such as phosphorus) or P-type impurities (B, BF$_2$, etc.) are injected into the polysilicon film 16 and WSi film 22. The injected impurities are later activated by suitable heat treatments to contribute significantly to providing electric conduction. polysilicon film 16 and WSi film 22. The injected impurities are later activated by suitable heat treatments to contribute significantly to providing electric conduction.

In recent years, diversification of data processing applications has entailed the development of system LSIs that combine a semiconductor memory with a logic LSI. For example, an eDRAM (embedded DRAM) combining a DRAM (Dynamic Random Access Memory) with a logic LSI is known as a system LSI capable of processing massive image data at high speed.

Steps for combining a DRAM with a logic LSI to fabricate a system LSI (eDRAM) may sometimes involve numerous heat treatments following the formation of MOS transistors to be included in the system LSI. During such heat treatments, impurities in the gate electrodes of the MOS transistors can diffuse into a gate insulating film or like components, resulting in a reduced density of impurities in the gate electrodes.

Such a drop in the impurity density of the gate electrodes or a sustained inactive state of the impurities in the electrodes may lead to a depletion layer in the electrodes getting inordinately large in proportion, a phenomenon called gate electrode depletion. The diffusion of impurities in the gate electrodes (gate electrode depletion) can trigger changes in MOS transistor characteristics. For these reasons, the conventional method has been associated with the problem of fluctuating MOS transistor characteristics, especially when applied to the fabrication of the system LSI.

SUMMARY OF THE INVENTION

It is therefore a first object of the present invention to overcome the above and other deficiencies of the prior art and to provide MOS transistors capable of exerting their required characteristics after undergoing heat treatments during DRAM fabrication processes.

It is a second object of the present invention to provide a method suitable for manufacturing the inventive MOS transistors.

The above objects of the present invention are achieved by a semiconductor device described below. The semiconductor device includes a silicon substrate. A gate insulating film is formed on the silicon substrate. A gate electrode is formed on the gate insulating film. The gate electrode includes an amorphous silicon film formed on the gate insulating film, a tungsten silicide film formed on the amorphous silicon film, and an insulating film formed on the tungsten silicide film.

The above objects of the present invention are also achieved by A method for manufacturing a semiconductor device including MOS transistors. In the manufacturing method, an isolation region is formed on a silicon substrate so as to isolate a plurality of MOS regions in which to form MOS transistors. A first insulating film is formed as a gate insulating film on the silicon substrate. An amorphous silicon film is formed on the first insulating film. A tungsten silicide film is formed on the amorphous silicon film. A second insulating film is formed on the tungsten silicide film. The first insulating film, the amorphous silicon film, the tungsten silicide film, and the second insulating film are patterned into gate electrodes.

Other objects and further features of the present invention will be apparent from the following detailed description when read in conjunction with the accompanying drawings.

BRIEF DESCRIPTION OF THE DRAWINGS

FIGS. 1A through 1F are cross-sectional views of a first embodiment of the invention as applied to a semiconductor device and to a method for manufacturing the same;

FIGS. 2A through 2F are cross-sectional views of a second and a third embodiment of the invention as applied to semiconductor devices and to methods for manufacturing the same;

FIGS. 3A through 3F are cross-sectional views of a fourth and a fifth embodiment of the invention as applied to semiconductor devices and to methods for manufacturing the same.

DESCRIPTION OF THE PREFERRED EMBODIMENTS

Figure 4A:
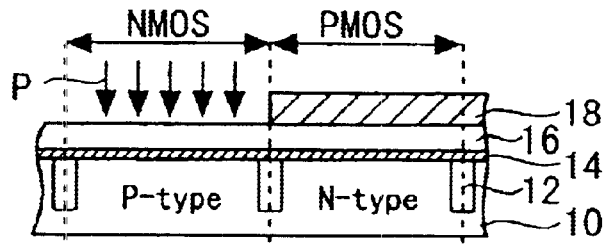
FIGS. 4A through 4F are cross-sectional views showing structures of conventional MOS transistors and steps for manufacturing the same.

Preferred embodiments of this invention will now be described with reference to the accompanying drawings. Throughout the drawings, like reference characters designate like or corresponding parts, and repetitive descriptions of such parts are omitted where appropriate.

First Embodiment

Figure 4B:
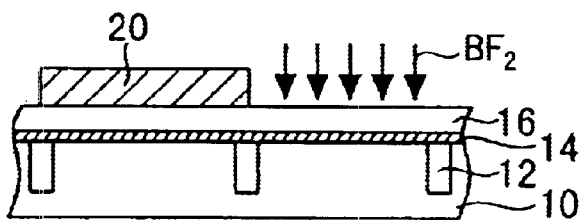
Figure 4C:
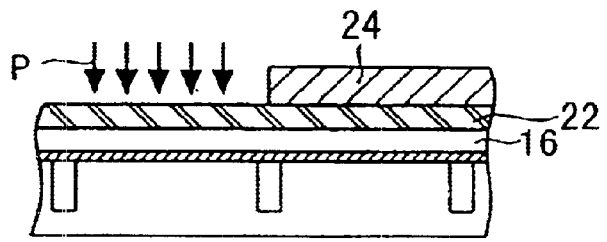
Figure 4D:
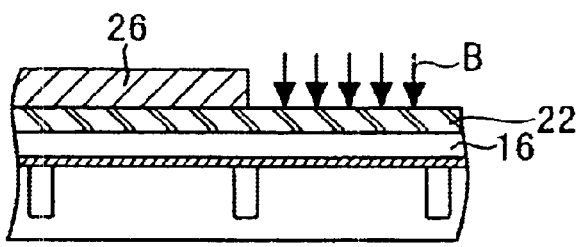
Figure 4E:
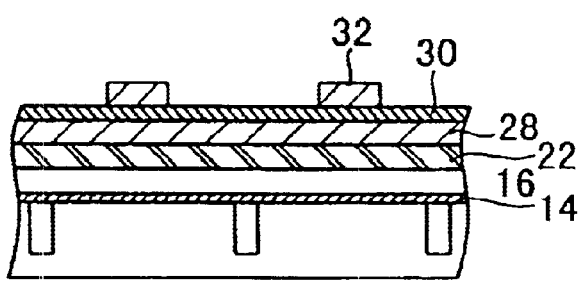
Figure 4F:
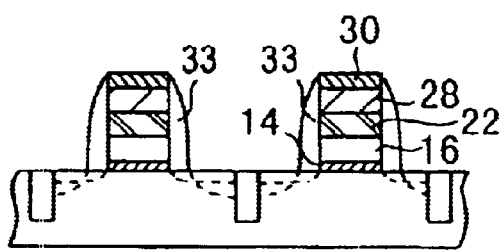

FIGS. 1A through 1F are cross-sectional views showing how MOS transistors are typically structured and fabricated in practicing the first embodiment of the invention. The manufacturing method made up of steps shown in FIGS. 1A through 1F is designed to produce MOS transistors in the WSi-polycide structure, with NMOS and PMOS transistors laid out adjacent to one another on a single substrate. The method of the first embodiment is the same as the above-described conventional manufacturing method except for the absence of steps for injecting P-type impurities into the PMOS regions of the polysilicon film 16 (steps 7 and 8 in FIG. 4B) and steps for injecting N-type impurities into the NMOS regions of the WSi film 22 (steps 10 and 11 in FIG. 4C).

As shown in FIG. 1A, this manufacturing method embodying the invention involves initially forming isolation regions 12 to a depth of 4,000 angstroms by use of an insulating film such as an oxide film on a silicon substrate 10. The isolation regions 12 are laid out so as to isolate NMOS and PMOS regions (where NMOS and PMOS transistors are to be formed respectively) from one another on the silicon substrate 10 (step 1).

The silicon substrate 10 is arranged so that the NMOS regions will serve as P-type semiconductors and PMOS regions as N-type semiconductors (step 2).

On the surface of the silicon substrate 10, a silicon oxide film 14 to be used later as a gate insulating film is formed to a thickness of 40 angstroms (step 3).

On the silicon oxide film 14, polysilicon is deposited by low-pressure CVD. This forms a polysilicon film 16 having a thickness of 1,000 angstroms (step 4).

On the polysilicon film 16, a resist film 18 is patterned so as to expose the NMOS regions while covering the PMOS regions (step 5).

With the resist film 18 used as a mask, N-type impurities consisting of phosphorus (P) are injected at 10 keV with a density of $8 \times 10^{15}$ atoms/cm$^2$ into the NMOS regions of the polysilicon film 16 (step 6).

As indicated in FIG. 1B, a WSi film 22 with a thickness of 1,000 angstroms is formed on the polysilicon film 16 (step 9). With this embodiment, as mentioned above, no impurities are injected into the PMOS regions of the polysilicon layer 16 when the WSi film 22 is formed over the surface.

As illustrated in FIG. 1C, a resist film 26 is patterned on the WSi film 22 so as to expose the PMOS regions while covering the NMOS regions (step 12).

With the resist film 26 used as a mask, P-type impurities consisting of boron (B) are injected at 10 keV with a density of $8 \times 10^{15}$ atoms/cm$^2$ into the PMOS regions of the WSi film 22 (step 13).

As depicted in FIG. 1D, a silicon oxide film 28 with a thickness of 1,000 angstroms is formed on the WSi film 22 (step 14). With this embodiment, as mentioned above, no impurities are injected into the NMOS regions of the WSi film 22 when the silicon oxide film 28 is formed on the surface.

A silicon nitride film 30 with a thickness of 500 angstroms is formed on the silicon oxide film 28 (step 15).

On the silicon nitride film 30, a resist film 32 is formed. The resist film 32 thus furnished is patterned into gate electrodes by photolithography (step 16).

As indicated in FIG. 1E, the silicon nitride film 30 is patterned into gate electrodes by etching, with the resist film 32 used as a mask (step 17).

The silicon nitride film 30 thus patterned is used as a mask for anisotropic etching whereby the silicon oxide film 28, WSi film 22, polysilicon film 16 and silicon oxide film 14 are patterned successively into gate electrodes (step 18).

As shown in FIG. 1F, N-type impurities are injected into the NMOS regions of the silicon substrate in order to form LDD (Lightly Doped Drain) regions. P-type impurities are injected into the PMOS regions of the substrate to form the same type of regions (step 19).

An insulating film such as a silicon oxide film is deposited all over the wafer. The insulating film thus furnished is subjected to anisotrophic etching whereby sidewalls 33 protecting the sides of the gate electrodes are formed (step 20).

N-type impurities are injected into the NMOS regions of the silicon substrate in order to form source and drain regions of the NMOS transistors. P-type impurities are injected into the PMOS regions of the substrate to form source and drain regions of the PMOS transistors (step 21).

The steps above, when carried out, fabricate the MOS transistors constituting the first embodiment of the invention.

According to the above-described manufacturing method embodying the invention, N-type impurities (P) to be injected into the gate electrodes of the NMOS transistors are implanted only into the polysilicon film 16. As a result, the polysilicon film 16 contains N-type impurities at a higher density than the WSi film 22. Furthermore, according to this method, P-type impurities (B) to be injected into the gate electrodes of the PMOS transistors are implanted only into the WSi film 22. This means that the WSi film 22 contains P-type impurities at a higher density than the polysilicon film 16.

As one of its properties, phosphorus (N-type impurities) injected into the NMOS regions has difficulty penetrating the silicon oxide film 14. For that reason, when phosphorus (P) is injected into the polysilicon film 16, the amount of impurities punched through the gate insulating film (i.e., silicon oxide film 14) is minimized. On the other hand, boron (P-type impurities) injected into the PMOS regions readily penetrates the silicon oxide film 14. Thus if boron (B) were injected into the polysilicon film 16, the amount of impurities punched through the gate insulating film (silicon oxide film 14) could be high. With this embodiment, the film through which to inject boron (B) is only the WSi film 22. This structure makes it possible sufficiently to minimize the amount of impurities pushed through the gate insulating film in both the NMOS and the PMOS regions.

Phosphorus injected into the NMOS regions is readily absorbed into the WSi film 22 during subsequent heat treatments. Thus to get phosphorus (P) highly concentrated in the polysilicon film 16 requires injecting the impurities at a high density into the film 16 before the heat treatments. Boron (B) injected into the PMOS regions tends to diffuse from the WSi film 22 into the polysilicon film 16 during heat treatments. Thus if boron is injected at a high density into the WSi film 22 before the heat treatments, the boron concentration in the polysilicon film 16 is sufficiently elevated during the treatments. In this manner, the inventive manufacturing method allows the impurity density to become sufficiently high in both the NMOS and the PMOS regions of the polysilicon film 16 following the heat treatments.

MOS transistors fabricated by the steps above were subjected to various heat treatments (at 650° C. through 850° C.) during DRAM processing. Thereafter, the transistors were measured for a depletion rate in gate electrodes and for the impurity density in gate insulating films. The depletion rate is a rate at which a depletion layer caused by a voltage being applied to the gate electrodes occupies the volume of the gate electrodes. Specifically, the depletion rate is measured as follows:

Initially, the capacity developed between the gate electrode and the substrate is measured in two cases: when the gate electrode is used as a positive pole, and when the substrate is used as a positive pole. Because the gate electrode of NMOS transistor is made up of N-type semiconductor, no depletion layer develops in the gate electrode if a negative voltage is applied thereto. With the above connection in place, it is possible to measure the capacity when there is no depletion layer. Meanwhile, if a positive voltage is applied to the gate electrode of NMOS transistor, a depletion layer occurs in the gate electrode. In this case, the capacity in effect when the depletion layer is present is measured. The capacity between the gate electrodes and the substrate drops as the depletion layer grows. With the first embodiment, that drop in the capacity is acquired as the depletion rate (e.g., if the capacity with the depletion layer present is 20 percent less than that which is in effect when there is no depletion layer, then the depletion rate is 20 percent).

The depletion rate after the heat treatments during DRAM processing was found to be about 45 percent for conventionally fabricated NMOS transistors and about 35 percent for conventionally fabricated PMOS transistors. The MOS transistors fabricated by the method of the first embodiment were found to have a slightly improved depletion rate following heat treatments compared with the conventionally produced MOS transistors. As opposed to conventional methods, the inventive method was judged to have a distinct effect on the amount of impurities diffusing into the gate insulating film. For these reasons, the MOS transistors of the first embodiment following DRAM processing provide more stable characteristics than conventional MOS transistors.

Second Embodiment

The second embodiment of this invention will now be described by referring to FIGS. 2A through 2F. FIGS. 2A through 2F are cross-sectional views showing the second embodiment as applied to MOS transistors and to a method for manufacturing these transistors.

As depicted in FIG. 2A, P-type impurities are first injected into NMOS regions of a polysilicon film 16 in the same relevant steps as those of the first embodiment (steps 1 through 6).

As illustrated in FIG. 2B, a silicon substrate 10 is thermally treated. The heat treatment carried out in a furnace at 800° C. to 850° C. is intended to activate phosphorus (P) injected into the polysilicon film 16 (step 22).

As shown in FIGS. 2C and 2D, a WSi film 22 is formed in the same relevant steps as those of the first embodiment. Boron (B) is then injected into PMOS regions of the WSi film 22 (steps 9, 12 and 13).

As indicated in FIG. 2E, the silicon substrate 10 is then thermally treated. This heat treatment carried out using heating lamps at 950° C. to 1,000° C. is intended mainly to activate boron (B) injected into the WSi film 22 (step 23).

Thereafter, as shown in FIG. 2F, gate electrodes are patterned, impurities are injected, and side walls 33 are fabricated in the same relevant steps as those of the first embodiment (steps 14 through 21).

The MOS transistors fabricated by the steps above were subjected to various heat treatments (at 650° C. through 850° C.) during DRAM processing. Then the transistors were measured for the depletion rate in the gate electrodes and for the impurity density in the gate insulating film. Both the NMOS and the PMOS transistors fabricated by the method of the second embodiment were found to have depletion rates of as low as 25 percent. Accordingly, the MOS transistors of the second embodiment provide even more stable characteristics than the transistors of the first embodiment.

Third Embodiment

The third embodiment of this invention will now be described by again referring to FIGS. 2A through 2F. According to the manufacturing method of the third embodiment, an amorphous silicon film 34 is formed instead of the polysilicon film 16 on the silicon oxide film 14 in step 4. Except for that step, the manufacturing method of the third embodiment is the same as that of the second embodiment. With this embodiment, MOS transistors are fabricated so as to contain the amorphous film 34 in their gate electrodes.

The MOS transistors fabricated by the method of the third embodiment were subjected to various heat treatments (at 650° C. through 850° C.) during DRAM processing. Then the transistors were measured for the depletion rate in the gate electrodes and for the impurity density in the gate insulating film. Both the NMOS and the PMOS transistors fabricated experimentally by this method were found to have depletion rates of as low as 10 percent. Accordingly, the MOS transistors of the third embodiment provide even more stable characteristics than the transistors of the second embodiment.

Fourth Embodiment

The fourth embodiment of this invention will now be described by referring to FIGS. 3A through 3F. FIGS. 3A through 3F are cross-sectional views of the fourth embodiment of the invention as applied to MOS transistors and to a method for manufacturing these transistors.

According to the manufacturing method of the fourth embodiment, as shown in FIGS. 3A and 3B, P-type impurities are injected into NMOS regions of an amorphous silicon film 34 in the same relevant steps as those of the third embodiment, followed by heat treatments to activate the injected impurities (steps 1 through 6 and 22).

As indicated in FIG. 3C, a nitride film 36 with a thickness of 20 to 40 angstroms is formed on the amorphous silicon film 34. The nitride film 36 is formed illustratively by the so-called RTN (rapid thermal nitride) technique, i.e., by having the silicon substrate 10 heated by lamps in an atmosphere containing nitrogen gas (step 24).

Thereafter, as shown in FIGS. 3D through 3F, a WSi film 22 is formed, impurities (B) are injected and activated, gate electrodes are patterned, and side walls 33 are fabricated in the same relevant steps as those of the third embodiment (steps 9, 12, 13, 23, and 14 through 21).

The MOS transistors fabricated by the steps above were subjected to various heat treatments (at 650° C. through 850° C.) during DRAM processing. Then the transistors were measured for the depletion rate in the gate electrodes and for the impurity density in the gate insulating film. Both the NMOS and the PMOS transistors fabricated experimentally by the method of the fourth embodiment were found to have depletion rates still lower than those of the third embodiment. Accordingly, the MOS transistors of the fourth embodiment provide even more stable characteristics than the transistors of the third embodiment.

Although the thin nitride film 36 was shown to be formed by the RTN technique between the amorphous silicon film 34 and the WSi film 22 in the fourth embodiment above, this is not limitative of the invention. Alternatively, a nitrogen compound film may be formed by nitrogen injection between the amorphous silicon film 34 and the WSi film 22, and the effects are still the same as when the nitride film 36 is formed therebetween.

Fifth Embodiment

The fifth embodiment of this invention will now be described by again referring to FIGS. 3A through 3F. According to the manufacturing method of the fifth embodiment, an oxide nitride film 38 is formed instead of the silicon oxide film 14 on the silicon substrate 10 in step 3. Except for that step, the manufacturing method of the fifth embodiment is the same as that of the fourth embodiment. With this embodiment, MOS transistors are fabricated so as to include the oxide nitride film 38 as the gate insulating film.

Like the silicon oxide film 14 in the first through the fourth embodiments, the oxide nitride film 38 has a thickness of about 40 angstroms. Such an oxide nitride film 38 is formed illustratively by thermally treating the silicon substrate 10 in a mixed gas made up of $O_2$ and NO, or of $O_2$ and $N_2O$.

Two kinds of MOS transistors were fabricated by the method of the fifth embodiment: those with their oxide nitride film 38 produced using the mixed gas of $O_2$ and NO, and those with their oxide nitride film 38 formed by use of the $O_2$ and $N_2O$ mixed gas. The transistors were subjected to various heat treatments during DRAM processing and thereafter measured for the depletion rate in the gate electrodes and for the impurity density in the gate insulating film. The measurements confirmed that the oxide nitride film 38 was significantly more effective than the silicon oxide film 14 in suppressing the diffusion of impurities. In particular, the oxide nitride film 38 produced by use of the mixed gas of $O_2$ and $N_2O$ was found to be more effective than the film 38 formed using the $O_2$ and NO mixed gas. Accordingly, the MOS transistors of the fifth embodiment provide even more stable characteristics than the transistors of the fourth embodiment.

The invention constituted and embodied as described above offers the following effects:

According to one aspect of the invention, a conductive layer of gate electrodes is formed by amorphous silicon and tungsten silicide. Amorphous silicon is more effective than polysilicon in suppressing the depletion of gate electrodes and inhibiting the diffusion of impurities. The inventive constitution thus implements MOS transistors that provide desired characteristics in a stable manner following heat treatments involved in DRAM processing.

In one preferred variation of the invention, N-type impurities may be injected mostly into the amorphous silicon film of the NMOS regions. Whereas N-type impurities are prone to be absorbed into the tungsten silicide film during heat treatments, a large amount of N-type impurities injected beforehand into the amorphous silicon helps effectively to inhibit the depletion of gate electrodes.

In another preferred variation of the invention, P-type impurities may be injected mostly into the tungsten silicide film of the PMOS regions. P-type impurities are prone to be punched through the gate insulating film when injected and is liable to diffuse into the amorphous silicon film during heat treatments. According to the invention, the amount of impurities punched through the gate insulating film is minimized while a sufficient quantity of impurities is secured within the gate electrodes. This makes it possible to stabilize MOS transistor characteristics.

In a further preferred variation of the invention, a nitride film or a nitrogen compound film may be formed between the amorphous silicon film and the tungsten silicide film to inhibit effectively the diffusion of impurities in the gate electrodes during heat treatments in DRAM processing. The invention thus makes it possible to implement MOS transistors that provide stable characteristics following the heat treatments.

In an even further preferred variation of the invention, an oxide nitride film may be formed as the gate insulating film to inhibit sufficiently the diffusion of impurities during heat treatments in DRAM processing. This makes it possible to implement MOS transistors that provide stable characteristics following the heat treatments.

In a still further preferred variation of the invention, N-type impurities contained in the gate electrodes of the NMOS transistors may be activated efficiently. This effectively prevents the depletion of the gate electrodes.

In a yet further preferred variation of the invention, P-type impurities contained in the gate electrodes of the PMOS transistors may be activated efficiently. This also effectively prevents the depletion of the gate electrodes.

Further, the present invention is not limited to these embodiments, but variations and modifications may be made without departing from the scope of the present invention.

The entire disclosure of Japanese Patent Application No. 2000-8998 filed on Jan. 18, 2000 including specification, claims, drawings and summary are incorporated herein by reference in its entirety.

What is claimed is:

1. A method for manufacturing a semiconductor device including MOS transistors, said method comprising the steps of:

forming an isolation region on a silicon substrate so as to isolate a plurality of MOS regions including an NMOS region and a PMOS region in which to form MOS transistors;

forming a first insulating film as a gate insulating film on said silicon substrate;

forming a silicon film on said first insulating film;

injecting N-type impurities into said silicon film within said NMOS region;

forming a tungsten silicide film on said silicon film;

injecting P-type impurities into said tungsten silicide film within said PMOS region;

forming a second insulating film on said tungsten silicide film; and patterning said first insulating film, said silicon film, said tungsten silicide film and said second insulating film into gate electrodes; wherein no P-type impurities are injected into said silicon film in said PMOS region, and no N-type impurities are injected into said tungsten silicide film in said NMOS region.

2. The method for manufacturing a semiconductor device according to claim 1, further comprising the step of, with said N-type impurities injected into said silicon film, subjecting said silicon substrate to heat treatments at 800 to 850° C. using a furnace.

3. The method for manufacturing a semiconductor device according to claim 1, further comprising the step of, with said P-type impurities injected into said tungsten silicide film, subjecting said silicon substrate to heat treatments at 950 to 1,000° C. by use of heating lamps.

4. The method for manufacturing a semiconductor device according to claim 1, further comprising the step of forming, between said silicon film and said tungsten suicide film, a nitride film with a thickness of 20 to 40 angstroms by heat treatments using heating lamps.

5. The method according to claim 4, wherein said silicon film is an amorphous silicon film.

6. The method for manufacturing a semiconductor device according to claim 1, further comprising the step of forming, between silicon film and said tungsten suicide film, a nitrogen compound film with a thickness of 20 to 40 angstroms through nitrogen injection.

7. The method for manufacturing a semiconductor device according to claim 1, wherein the step of forming said first insulating film further includes the step of forming an oxide nitride film using a mixed gas made up of either $O_2$ and NO, or $O_2$ and $N_2O$.

8. The method for manufacturing a semiconductor device according to claim 1, wherein said silicon film is an amorphous silicon film.

9. The method of manufacturing a semiconductor device according to claim 1, wherein said silicon film is a polysilicon film.

* * * * *